United States Patent [19]

Aoki et al.

[11] 4,316,205
[45] Feb. 16, 1982

[54] SOLID-STATE IMAGING DEVICE

[75] Inventors: Masakazu Aoki, Hachioji; Iwao Takemoto, Kodaira; Masaharu Kubo, Hachioji; Ryuichi Izawa, Kokubunji, all of Japan

[73] Assignee: Hitachi, Ltd., Tokyo, Japan

[21] Appl. No.: 119,383

[22] Filed: Feb. 7, 1980

[30] Foreign Application Priority Data

Feb. 19, 1979 [JP] Japan ................................ 54-17340

[51] Int. Cl.³ ............................................ H01L 27/14
[52] U.S. Cl. ...................................... 357/30; 357/31; 357/23; 357/41
[58] Field of Search ...................... 357/30, 31, 23, 41

[56] References Cited

U.S. PATENT DOCUMENTS

| | | | |
|---|---|---|---|
| 4,143,389 | 3/1979 | Koike et al. | 357/31 |
| 4,148,051 | 4/1979 | Koike et al. | 357/30 |
| 4,223,330 | 9/1980 | Koike et al. | 357/32 |

*Primary Examiner*—Martin H. Edlow
*Attorney, Agent, or Firm*—Craig and Antonelli

[57] ABSTRACT

In a solid-state imaging device having in one major surface region of a monolithic semiconductor body, photodiodes which are arrayed in two dimensions, vertical switching MOS transistors and horizontal switching MOS transistors which address the photodiodes, MOS transistors which constitute vertical and horizontal scanning circuits for turning "on" and "off" the switching MOS transistors, and MOS transistors which constitute other peripheral circuitry, the photodiodes being constructed of source regions of the vertical switching MOS transistors and the semiconductor body; a solid-state imaging device characterized in that among source and drain regions of the various MOS transistors, the source regions of the vertical switching MOS transistors are lower in the surface impurity concentration and deeper in the junction depth than the other source and drain regions.

30 Claims, 3 Drawing Figures

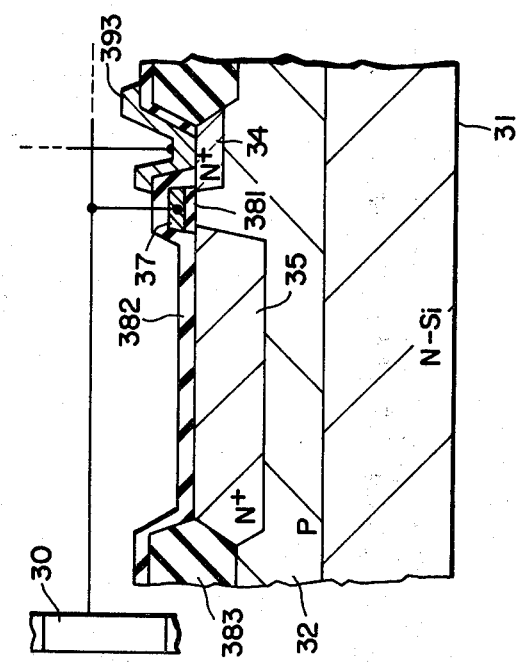
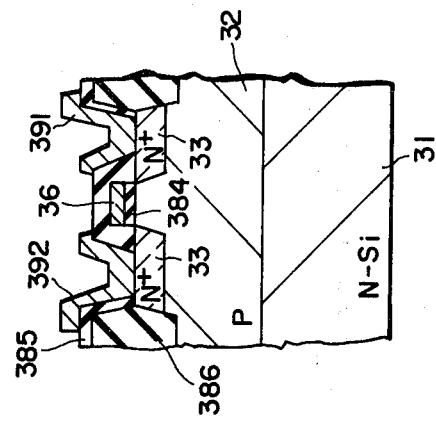
FIG. 3A
FIG. 3B

SOLID-STATE IMAGING DEVICE

BACKGROUND OF THE INVENTION (1) Field of the Invention

This invention relates to a solid-state imaging device (or solid-state photosensor) in which photoelectric conversion elements and scanning circuits (scanners) are integrated on a monolithic semiconductor body.

More particularly, this invention relates to a solid-state imaging device in which insulated-gate field effect transistors (MOS transistors) constituting the device are improved.

(2) Description of the Prior Art

A solid-state imaging device for use in a television camera needs to have resolution which is equivalent to that of an image pickup tube employed in the present television broadcast. To this end, the solid-state imaging device requires photoelectric conversion elements on the order of 500 (vertical)×400 (horizontal) picture elements, switching elements for X-Y addressing which correspond to the respective photoelectric conversion elements, and a horizontal scanning circuit and a vertical scanning circuit which turn "on" or "off" the switching elements and each of which is constructed of about 500 stages. Accordingly, it is usually fabricated by the use of the MOS-LSI technology with which a high packaging density is realized comparatively easily. FIG. 1 is a diagram for explaining the outline of such solid-state imaging device. Numeral 11 designates a horizontal scanning circuit for X or column addressing, and numeral 12 a vertical scanning circuit for Y or row addressing. Numeral 13 designates a vertical switching MOS transistor (hereinbelow, abbreviated to "MOST") which is turned "on" or "off" by a scanning pulse from the scanning circuit 12, numeral 14 a photodiode which exploits the source junction of the vertical MOST 13, and numeral 15 a vertical signal output line to which the drains of the vertical MOSTs 13 are connected in common. Numeral 16 indicates a horizontal switching MOST which is turned "on" or "off" by a scanning pulse from the horizontal scanning circuit 11 and which has its drain connected to a horizontal signal output line 17 and its source connected to the vertical signal output line 15. Shown at 18 is a driving voltage source for the photodiodes (video voltage source) which is connected to the horizontal signal output line 17 through a resistor 19. Numeral 20 indicates a signal output terminal. The two, horizontal and vertical scanning circuits turn "on" or "off" the switching MOSTs 16 and 13 one by one, to read out through the resistor 19 photocurrents from the photodiodes arrayed in two dimensions. Since the signals from the photodiodes correspond to an optical image of an object projected on these elements, video signals can be derived by the above operation. The features of the solid-state imaging device of this type are that the source of the switching MOST can be utilized for the photoelectric conversion and that a MOS shift register can be utilized for the scanning circuit.

Accordingly, it is ordinarily fabricated by the use of the MOS-LSI technology with which a high integration is comparatively easy and regarding which an example of a picture element structure is shown in FIG. 2. The picture element structure in FIG. 2 has been disclosed in U.S. Pat. No. 4,148,048. In FIG. 2, numeral 23 denotes a semiconductor substrate of the N-type conductivity for integrating photoelectric conversion elements, scanning circuits etc., and numeral 24 a well of a semiconductor region of the P-type conductivity formed in a surface region of the N-type semiconductor substrate. Numeral 13 indicates a vertical switching MOST provided with a gate electrode 25 to which a vertical scanning pulse from a vertical scanning circuit 12 is applied. Shown at 26 is the source of the MOST 13, which is a high impurity concentration region of the N-type conductivity and which forms a photodiode 14 at its PN-junction with the P-type well region. Shown at 27 is the drain of the MOST 13, which is a high impurity concentration region of the N-type conductivity and which is connected with a conductor layer 28 serving as a vertical signal output line 15. One end of the signal output line 28 (15) to which the drains of a plurality of switching MOSTs are connected in common is connected to a horizontal switching MOST 16 which is turned "on" or "off" by a horizontal scanning pulse from a horizontal scanning circuit 11, and the end of the switching MOST 16 remote from the signal output line 28 (15) is connected to a horizontal signal output line 17. The well region 24 and the substrate 23 are usually fixed to the ground voltage (zero V) (in some cases, the PN-junction between the well region and the substrate is reverse-biased). Numerals 291, 292 and 293 indicate insulating films, which are ordinarily $SiO_2$ films.

The photodiode charged up to a video voltage $V_v$ by the scanning is discharged ($\Delta V_v$) in accordance with the quantity of light having entered during one frame period. When the switching MOSTs 13 and 16 turn "on" in the next scanning, a charging current for charging the discharged component flows. This charging current is read out through a resistor 19 connected to a video voltage source 18, and a video signal can be provided at an output terminal 20.

The solid-state imaging device provided with the picture element structure shown in FIG. 2 disposes the P-type well region and forms the photoelectric conversion element in the well region, and can therefore prevent the occurrence of blooming. In addition, since infrared light is mostly absorbed within the substrate, the degradation of the resolution is not incurred, and the sensitivity in visible light is flattened to make it possible to obtain the video signal faithful to the object. This device has such many advantages. It has the most excellent characteristics among image pickup devices which have been proposed and developed up to the present time.

In order to make these solid-state imaging devices practicable, it is desirable from the viewpoint of yield that the die size or pellet size is as small as possible. However, a considerably high packaging density is needed in order to realize, for example, the solid-state imaging device of 500×400 picture elements on a scanning area for the ⅔ inch lens format (6.6 mm×8.8 mm). In integrating the photodiodes and the switching transistors or peripheral circuits on such small area, the newest high-density LSI fabrication technique is required. In actuality, such a technique of making the gate length of the MOS transistor 3 μm or less is being applied to the solid-state imaging device. It has been revealed, however, that in case of applying such high-density LSI fabrication technique to the solid-state imaging device, there are the following two points as inherent problems:

1. Especially in a color image pickup device, a device in the case of employing a light source of short wavelength light, etc., the sensitivity to light on the short wavelength side (approximately 400–550 nm) is important. Since the absorption coefficient of silicon (Si) for the light of short wavelength is great, the light having entered the PN-junction is photoelectrically converted near the Si surface, generated minority carriers arriving at the junction portion owing to the diffusion or a drift field based on the gradient of concentration. At this time, however, when the impurity concentration (hereinbelow, termed the "surface impurity concentration") particularly in the vicinity of the Si surface (within 0.1 μm–0.2 μm from the surface) exceeds about $2 \times 10^{20}/cm^3$, the photoelectric conversion efficiency degrades and it is as low as 60–70% as compared with that in the case where the concentration is lower than the aforecited value.

On the other hand, in a high integration LSI, it is common practice that as the gate length of the MOS transistor is made shorter, the PN-junctions of the source and drain of the MOST have the junction depth $x_j$ shallowed (usually, $x_j < 0.5$ μm for gate lengths of or below 3 μm) for such reasons as preventing the degradation of the punch-through breakdown voltage, the increases of the sheet resistance of the source and drain regions ascribable to this measure being compensated for by increasing the impurity concentration. In this regard, the solid solubility limit of phosphorus in the Si substrate is about $1 \times 10^{21}/cm^3$, that of arsenic is about $2 \times 10^{21}/cm^3$ and that of boron is about $4 \times 10^{20}/cm^3$ (all the values being at 1,000° C.), and hence, the Si surface impurity concentrations of the source and drain regions exceed about $2 \times 10^{20}/cm^3$ in the short-channel MOST in many cases. For the aforecited reason, accordingly, the MOST in the picture element of the solid-state imaging device cannot be put into the short channel by this method.

2. Since the absorption coefficient of Si for light on the long wavelength (about 600 nm or longer) side is small, the average position at which the photoelectric conversion takes place lies at a deep part of the Si substrate. As compared with the short-wavelength light, the long-wavelength light is low in the reflection factor at the Si surface and reaches the interior of the Si substrate well. Therefore, in order to establish the balance between the long- and short-wavelength lights, the sensitivity to the long-wavelength light is lowered particularly in a color photosensor by employing an infrared cutting filter or contriving the structure. However, in the PN-junction of $x_j < 0.5$ μm or so employed in the high integration LSI as stated in 1, it is sometimes the case that the sensitivity to the long-wavelength light lowers excessively and that the balance with the short-wavelength light is lost.

SUMMARY OF THE INVENTION

This invention has for its object to provide a solid-state imaging device which has a high integration density and whose sensitivities to long- and short-wavelength lights balance.

More specifically, an object of this invention is to provide a solid-state imaging device in which, without lowering the sensitivity to short-wavelength light, a switching MOST or a MOST of a scanning circuit is put into a short channel by employing highly doped impurity regions.

A further object of this invention is to provide a solid-state imaging device in which, without excessively lowering the sensitivity to long-wavelength light, a switching MOST is put into a short channel by employing a shallow impurity region.

In order to accomplish the objects, according to a solid-state imaging device of this invention, the source region of a vertical switching MOS transistor, that is, an impurity region to form a photodiode is endowed with a deep junction depth and a low impurity concentration, and the other impurity regions, that is, the drain regions of the vertical switching MOS transistor, and/or the source and drain regions of a horizontal switching MOS transistor, and/or the source and drain regions of MOSTs constituting respective scanning circuits, and/or the source and drain regions of MOSTs constituting any other peripheral circuit which requires a high integration circuit are endowed with a shallow junction depth and a high impurity concentration. Thus, the solid-state imaging device of this invention can have a high integration density while holding the balance between its sensitivities to long- and short-wavelength lights.

BRIEF DESCRIPTION OF THE DRAWINGS

FIG. 3A is a sectional view showing the structure of a picture element portion in a solid-state imaging device embodying this invention.

FIG. 3B is a sectional view showing the structure of a MOS transistor other than a vertical switching MOS transistor in the solid-state imaging device embodying this invention.

DESCRIPTION OF THE PREFERRED EMBODIMENT

Figure 1:
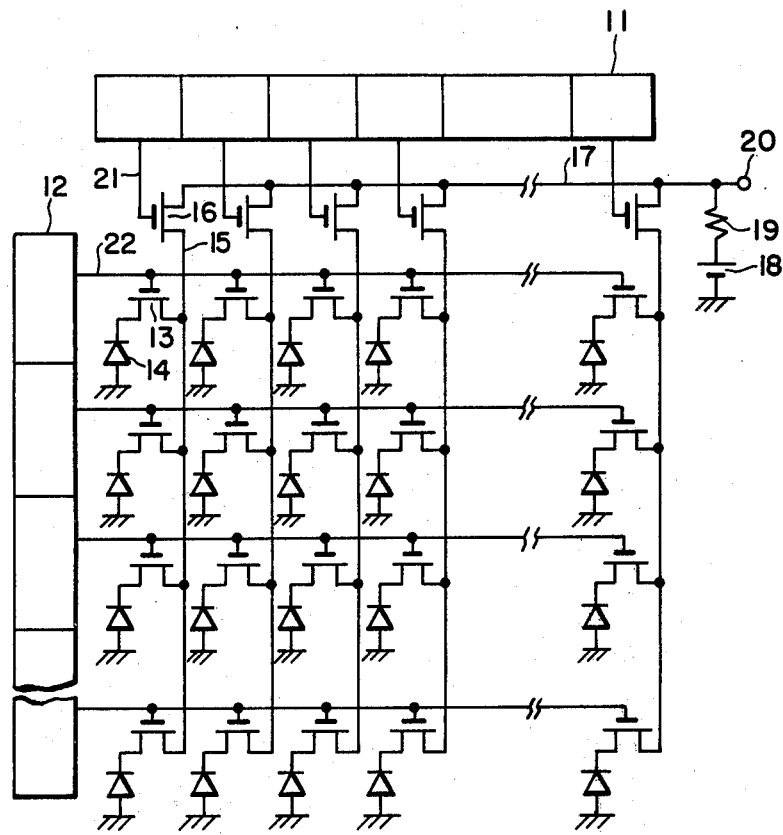
FIG. 1 is a schematic circuit diagram showing the outline of a solid-state imaging device.
Figure 2:
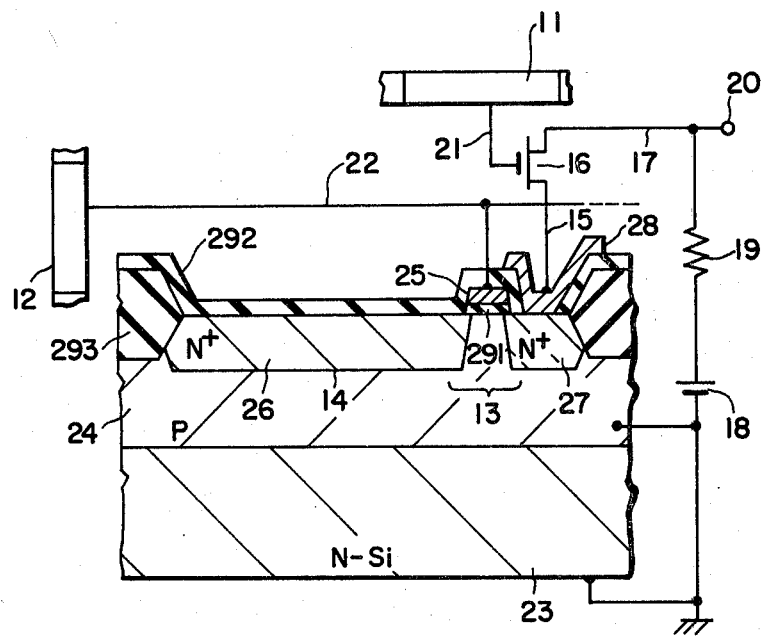
FIG. 2 is a sectional view showing the structure of a picture element portion in a prior-art solid-state imaging device.

Hereunder, this invention will be described in detail with reference to an embodiment.

FIGS. 3A and 3B show an embodiment of a solid-state imaging device (or solid-state photosensor) of this invention. FIG. 3A illustrates the sectional structure of a picture element portion, while FIG. 3B illustrates the sectional structure of a peripheral circuit portion.

In the figures, numeral 30 designates a vertical scanning circuit, numeral 31 an Si substrate of the N-type conductivity, and numeral 32 an Si layer of the P-type conductivity. Numerals 33, 34 and 35 designate highly doped impurity regions of the N-type conductivity. The N+-type impurity region 33 is the source or drain of a short-channel MOST of a signal processing circuit including a horizontal switching MOST or of a peripheral circuit such as scanning circuit (or scanner). The N+-type impurity regions 34 and 35 are the drain and source of a switching MOST for reading out a signal (mainly, vertical switching MOST), respectively. The N+-type region 35 constructs a photodiode together with the P-type layer 32. Numeral 36 indicates the gate electrode of the short-channel MOST of the peripheral circuit, the gate electrode being made of polycrystalline Si or the like. Numeral 37 indicates the gate electrode of the switching MOST for reading out the signal (mainly, vertical switching MOST), the gate electrode being made of polycrystalline Si or the like. Numerals 381–386 denote insulating films which are SiO$_2$ films or the like. Numerals 391 and 392 denote interconnection layers of the peripheral circuit which are made of Al or the like and which are connected to the source and drain. Numeral 393 denotes an interconnection layer which is made of Al or the like and which serves as a signal readout line.

The embodiment of this invention shown in FIGS. 3A and 3B has realized by employing the short-channel MOSTs a solid-state imaging device wherein the sources and drains 33 and 34 are endowed with a junction depth $x_j < 0.5$ μm and a surface impurity concentration of about $2 \times 10^{20}$/cm$^3$ or higher (not higher than about 40 Ω/□ in terms of the sheet resistance), thereby attaining a high integration density, while in the photodiodes the N+-type regions 35 are endowed with a surface impurity concentration of about $1 \times 10^{20}$/cm$^3$ or lower and a junction depth $x_j \approx 0.7$ μm, thereby achieving an appropriate spectral response for the color image pickup over a wavelength region from short wavelengths to long wavelengths.

One of the reasons why the N-type substrate is disposed under the P-type layer in FIG. 3A is that the long-wavelength light is partly cut to balance the entire spectral response. The same effect is obtained in such a way that a P-type substrate of low impurity concentration is prepared as the substrate 31 and that the P-type layer 32 is made one having a gradient of the impurity concentration by a method such as diffusion process after ion-implantation. When the thickness of the P-type layer 32 is approximately 1.5-5 μm and the impurity concentration is on the order of $10^{15}$-$10^{17}$/cm$^3$, the junction depth $x_j$ of the N+-type region 35 is made 0.5-1.0 μm, whereby a balanced long wavelength sensitivity is attained.

In FIG. 3A, the N+-type region 34 is shown as having a junction depth $x_j$ equal to that of the N+-type region 33 in FIG. 3B. Since, however, the switching MOST for reading out the signal does not require a very high transfer conductance ($g_m$), the junction depth may well be changed by, for example, equalizing the depth $x_j$ of the N+-type region 34 to that of the N+-type region 35. Further, at this time, the surface impurity concentration of the N+-type region 34 may well be made $2 \times 10^{20}$/cm$^3$ or less. In this case, the length at the gate 37 is made greater than that shown in FIG. 3A.

In the illustration and description of the above embodiment of this invention, the conductivity types may well be inverted, and quite the same effects are achieved.

It is to be understood that the condition of the surface impurity concentration of the photodiode according to this invention is applicable, not only to the solid-state color imaging device, but also to a solid-state monochromatic imaging device in the case where a sensitivity to short-wavelength light is required.

The materials or substances in the embodiment of this invention may well be replaced with their equivalents. For example, the polycrystalline Si film may well be replaced with a different conductive film of molybdenum or the like or with a composite film of such materials, the SiO$_2$ film with a different insulating film such as phosphosilicate glass (PSG) film and silicon nitride film or with a composite film of such materials, and the Al film with a different conductive film of polycrystalline Si, molybdenum or the like or with a composite film of such materials. In addition, even when these films are covered with a passivation film (of, for example, phosphosilicate glass), the effects of this invention are similarly achieved.

Although, in the above, the N-channel MOS transistors have been referred to in the description, the device can be constructed with P-channel MOS transistors by inverting the conductivity types and the voltage polarities.

As set forth above, according to this invention, the regions to form the photodiodes have the surface impurity concentration made at most approximately $2 \times 10^{20}$/cm$^3$, and the regions to form the sources and drains of the MOSTs requiring the high integration, these regions forming no photodiode, have the surface impurity concentration made at least approximately $2 \times 10^{20}$/cm$^3$ and the junction depth made at least 0.5 μm, whereby the highly integrated solid-state imaging device having the high sensitivity to the light of short wavelength can be provided. Especially in the solid-state color imaging device, the junction depth of the PN-junctions forming the photodiodes is made 0.5-1.0 μm, whereby the photosensor having the balanced long wavelength sensitivity can be realized.

What is claimed is:

1. In a solid-state imaging device having in one major surface region of a monolithic semiconductor body, photodiodes which are arrayed in two dimensions, vertical switching MOS transistors and horizontal switching MOS transistors which address the photodiodes, MOS transistors which constitute vertical and horizontal scanning circuits for turning "on" and "off" the switching MOS transistors, and MOS transistors which constitute other peripheral circuitry, the photodiodes being constructed of source regions of the vertical switching MOS transistors and the semiconductor body; a solid-state imaging device characterized in that the source region of said each vertical switching MOS transistor has a surface impurity concentration lower than, and a junction depth deeper than, those of an impurity region of at least one of (1) a drain region of said each vertical switching MOS transistor, (2) a source or drain region of said each horizontal switching MOS transistor, (3) a source or drain region of said each MOS transistor of said horizontal scanning circuit, (4) a source or drain region of said each MOS transistor of said vertical scanning circuit, and (5) a source or drain region of said each MOS transistor of said other peripheral circuitry.

2. In a solid-state imaging device having in one major surface region of a monolithic semiconductor body, photodiodes which are arrayed in two dimensions, vertical switching MOS transistors and horizontal switching MOS transistors which address the photodiodes, MOS transistors which constitute vertical and horizontal scanning circuits for turning "on" and "off" the switching MOS transistors, and MOS transistors which constitute other peripheral circuitry, the photodiodes being constructed of source regions of the vertical switching MOS transistors and the semiconductor body; a solid-state imaging device characterized in that the source region of said each vertical switching MOS transistor has a surface impurity concentration lower than, and a junction depth deeper than, those of an impurity region of at least one of a source or drain region of said each horizontal switching MOS transistor, a source or drain region of said each MOS transistor of said horizontal scanning circuit, a source or drain region of said each MOS transistor of said vertical scanning circuit, and a source or drain region of said each MOS transistor of said other peripheral circuitry, and further characterized in that said drain region of said each vertical switching MOS transistor is substantially equal to said source region of said each vertical switching MOS transistor in the surface impurity concentration and the junction depth.

3. The solid-state imaging device as defined in claim 1, characterized in that said source region of said each vertical switching MOS transistor has a surface impurity concentration of at most $2 \times 10^{20}/cm^3$ and a junction depth of at least 0.5 µm.

4. The solid-state imaging device as defined in claim 3, characterized in that the source and drain regions other than the source regions of said vertical switching MOS transistors have a surface impurity concentration of at least $2 \times 10^{20}/cm^3$ and a junction depth of at most 0.5 µm.

5. The solid-state imaging device as defined in claim 3, characterized in that the junction depth of said source region of said each vertical switching MOS transistor lies in a range of from 0.5 µm to 1.0 µm.

6. A solid-state imaging device, comprising a semiconductor body containing a plurality of picture element regions, and signal coupling circuit regions associated therewith for selectively addressing the picture element regions so as to read out therefrom signals representative of radiation incident thereon, and wherein said picture element regions and said signal coupling regions are formed of semiconductor regions of a conductivity type opposite to the conductivity type of said semiconductor body, said semiconductor regions extending into said semiconductor body from a surface thereof, and wherein the depth of the picture element semiconductor regions is greater than that of prescribed ones of the signal coupling semiconductor regions.

7. A solid-state imaging device according to claim 6, wherein the depth of the picture element semiconductor regions is at least 0.5 µm and the surface impurity concentration thereof is at most $2 \times 10^{20}$ cm$^{-3}$.

8. A solid-state imaging device according to claim 7, wherein the depth of the prescribed ones of the signal coupling semiconductor regions is at most 0.5 µm and the surface impurity concentration thereof is at least $2 \times 10^{20}$ cm$^{-3}$.

9. A solid-state imaging device according to claim 7, wherein the depth of the picture element semiconductor regions lies in a range of 0.5 µm to 1.0 µm.

10. A solid-state imaging device, comprising a semiconductor body containing a plurality of picture element regions, and signal coupling circuit regions associated therewith for selectively addressing the picture element regions so as to read out therefrom signals representative of radiation incident thereon, and wherein said picture element regions and said signal coupling regions are formed of semiconductor regions of a conductivity type opposite to the conductivity type of said semiconductor body, said semiconductor regions extending into said semiconductor body from a surface thereof, and wherein the surface impurity concentration of the picture element regions is less than that of prescribed ones of the signal coupling semiconductor regions.

11. A solid-state imaging device according to claim 10, wherein the depth of the picture element semiconductor regions is greater than that of the prescribed ones of the signal coupling semiconductor regions.

12. A solid-state imaging device according to claim 10, wherein the surface impurity concentration of the picture element semiconductor regions is at most $2 \times 10^{20}$ cm$^{-3}$.

13. A solid-state imaging device according to claim 10, wherein the surface impurity concentration of the prescribed ones of the signal coupling semiconductor regions is at least $2 \times 10^{20}$ cm$^{-3}$.

14. A solid-state imaging device according to claim 11, wherein the depth of the picture element semiconductor regions is at least 0.5 µm and the surface impurity concentration thereof is at most $2 \times 10^{20}$ cm$^{-3}$.

15. A solid-state imaging device according to claim 14, wherein the depth of the prescribed ones of the signal coupling semiconductor regions is at most 0.5 µm and the surface impurity concentration thereof is at least $2 \times 10^{20}$ cm$^{-3}$.

16. A solid-state imaging device according to claim 14, wherein the depth of the picture element semiconductor regions lies in a range of 0.5 µm to 1.0 µm.

17. A solid-state imaging device according to claim 6, wherein said plurality of picture elements are formed of an array of photodiodes which constitute one of the source and drain regions of first switching field effect transistors through which the photodiodes are selectively addressed for selectively reading out said signals representative of radiation incident thereon.

18. A solid-state imaging device according to claim 17, wherein said signal coupling circuit regions include source and drain regions of field effect transistors which constitute scanning circuits for turning said first switching field effect transistors on and off.

19. A solid-state imaging device according to claim 18, wherein said signal coupling circuit regions include source and drain regions of output switching field effect transistors coupled to said first switching field effect transistors and selectively turned on and off by said scanning circuits, for coupling the signals read out from said photodiodes to an output.

20. A solid-state imaging device according to one of claims 17 or 19, wherein said prescribed ones of said signal coupling circuit regions comprise the other of the source and drain regions of said first switching field effect transistors.

21. A solid-state imaging device according to one of claims 18 or 19, wherein said prescribed ones of said signal coupling circuit regions comprise the source or drain regions of scanning circuit field effect transistors.

22. A solid-state imaging device according to claim 19, wherein said prescribed ones of said signal coupling circuit regions comprise the source or drain regions of said output switching field effect transistors.

23. A solid-state imaging device according to claim 19, wherein said prescribed ones of said signal coupling circuit regions comprise each of the other of the source and drain regions of said first switching field effect transistors, the source and drain regions of the scanning field effect transistors and the source and drain regions of the output switching field effect transistors.

24. A solid-state imaging device according to claim 11, wherein said plurality of picture elements are formed of an array of photodiodes which constitute one of the source and drain regions of first switching field effect transistors through which the photodiodes are selectively addressed for selectively reading out said signals representative of radiation incident thereon.

25. A solid-state imaging device according to claim 24, wherein said signal coupling circuit regions include source and drain regions of field effect transistors which constitute scanning circuits for turning said first switching field effect transistors on and off.

26. A solid-state imaging device according to claim 19, wherein said signal coupling circuit regions include source and drain regions of output switching field effect transistors coupled to said first switching field effect transistors and selectively turned on and off by said scanning circuits, for coupling the signals read out from said photodiodes to an output.

27. A solid-state imaging device according to one of claims 24 or 26 wherein said prescribed ones of said signal coupling circuit regions comprise the other of the source and drain regions of said first switching field effect transistors.

28. A solid-state imaging device according to one of claims 25 or 26, wherein said prescribed ones of said signal coupling circuit regions comprise the source or drain regions of scanning circuit field effect transistors.

29. A solid-state imaging device according to claim 26, wherein said prescribed ones of said signal coupling circuit regions comprise the source or drain regions of said output switching field effect transistors.

30. A solid-state imaging device according to claim 26, wherein said prescribed ones of said signal coupling circuit regions comprise each of the other of the source and drain regions of said first switching field effect transistors, the source and drain regions of the scanning field effect transistors and the source and drain regions of the output switching field effect transistors.

* * * * *